United States Patent
Tsai et al.

(10) Patent No.: US 6,395,996 B1
(45) Date of Patent: May 28, 2002

(54) MULTI-LAYERED SUBSTRATE WITH A BUILT-IN CAPACITOR DESIGN

(75) Inventors: Chen-Wen Tsai, Hsinchu; Chung-Ju Wu, Kaohsiung; Wei-Feng Lin, Hsinchu, all of (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 09/571,242

(22) Filed: May 16, 2000

(51) Int. Cl.[7] ................................................. H05K 1/16
(52) U.S. Cl. ...................... 174/260; 174/264; 361/761; 361/763
(58) Field of Search ..................... 174/260, 262–266; 361/761–766

(56) References Cited

U.S. PATENT DOCUMENTS

| | | | | |
|---|---|---|---|---|
| 5,396,397 A | * | 3/1995 | McClanahan et al. ....... | 361/313 |
| 5,926,377 A | * | 7/1999 | Nakao et al. ................ | 361/763 |
| 6,215,372 B1 | * | 4/2001 | Novak .......................... | 333/12 |
| 6,215,649 B1 | * | 4/2001 | Appelt et al. ................ | 361/312 |

* cited by examiner

Primary Examiner—Kamand Cuneo
Assistant Examiner—Jeremy Norris
(74) Attorney, Agent, or Firm—Kinney & Lange, P.A.

(57) ABSTRACT

A multi-layered substrate having built-in capacitors is used to decouple high frequency noise generated by voltage fluctuations between a power plane and a ground plane of a multi-layered substrate. At least one kind of dielectric material, which is filled in through holes between the power plane and the ground plane, with high dielectric constant is used to form the built-in capacitors.

1 Claim, 5 Drawing Sheets

MULTI-LAYERED SUBSTRATE WITH A BUILT-IN CAPACITOR DESIGN

BACKGROUND OF THE INVENTION

1. Field of the Invention

The present invention relates to a multi-layered substrate manufacture and more particularly to a design of built-in capacitors in flip-chip build-up substrate and in BGA substrate.

2. Description of the Prior Art

Recently, with the advent of the microelectronic devices, the trend of device design is demanded to scale down not only to the active-devices, such as transistors but also to the passive-devices, such as resistors in order to increase the integral per unit chip and make the cost down. The design of the printed circuit board (PCB) used to mount the IC chip and the interconnection thereof have become a trend of forming the multi-layered PCB as well. In general, a basic PCB is formed of a dielectric layer and a conductive layer, which has connection thereon. A multi-layered PCB means several of basic PCB boards assembled sequentially together. The top layer provides ICs and other electronic devices (e.g. resistors, capacitors and varieties connectors) supporting and the underlying layers embedded with interconnection circuits. The interconnection between layer to layer is through the plated through holes or vias.

Referring to FIG. 1, for the purpose of alleviating the interference during the signal transferring, the signal plane 10, the power plane 20 and ground plane 30 on the multi-layered substrate are usually designed individually. The signal planes are conductive trace layers mounting on a dielectric layer 15 and 25; for instance, the BT glass fiber, FR4, or the epoxy dielectric layer. However, one of the problems associated with the use of multi-layered substrate is the voltage fluctuation between the power plane 20 and the ground plane 10 or the ground bouncing during the IC circuit operations including switch operations. Particularly, for the devices having high-speed performance, the switch rate becomes sufficiently high. As a result, the voltage fluctuation becomes more and more serious. In order to alleviate the issues and to decrease the noises resulting from the voltage fluctuations, the conventional approach is to use a by-pass capacitor connecting between a power ring 40 and a ground ring 35, which are formed on the top signal layer. The capacitor was connected to the power ring 40 and ground ring 35 through via holes that connect to the power plane 20 and to the ground plane 30, respectively, so as to filter the noises and stabilize the voltages.

The capacitor assembled to the substrate requires extra-steps to pick and place, and thus increases the cycle time of process and decreases the reliability as well. However, the performance of devices on the high switch frequency operation needs a capacitor to maintain it. And for the present IC designs, especially to the PCB used in the computer field, the current in the power plane usually suffers a problem in high frequency (above than 200 MHz). Alternatively, another conventional approach proposed is to use the natural capacitance between power and ground plane. In that method, the thickness of the dielectric layer between the power plane and the ground plane is decreased if it is intended to form sufficient large capacitance. The method though solves the cycle time during assembling. However, for the thickness of the dielectric layer 25 between the power plane 20 and the ground plane 30 required special design that the process is inflexible. Besides, another group of the power plane and the ground plane will be required in order to increase the capacitance in advance.

In addition to aforementioned PCB, for the purpose of increasing the clock speed of the system and having more multi-functions in unit chip, the devices within a chip are necessary to be drastically increased. As a consequence, the number of a IC chip package leads become very huge. For example, the package of the pin grid array (PGA) has leads over 200 in repose to the demanded of great number of interconnections and the I/O requirement. Furthermore, the flip-chip build up technique and the ball grid array (BGA) etc., have been constructed recently in repose to the high speed devices and a large number of I/O leads. However, with the increasing switching rate in a chip, the noise interference becomes more and more serious than before. Therefore, the multi-layered substrate for BGA package or flip-chip package chips is necessary having noise decouple capacitors. Unfortunately, in a limited space as a build up substrate or BGA substrate, to build the capacitors are more difficult than general PCB. And thus an object of the present invention herein is to provide a high efficiency method by forming the built-in capacitors, which have more flexibility than prior art.

SUMMARY OF THE INVENTION

An object of the present invention is to provide a multi-layered substrate with built-in capacitors structure and the manufacture method thereof.

An another object of the present invention is to solve the pick and place of exterior capacitor, which is on the top signal layer.

The present invention discloses a multi-layered substrate having built-in capacitors. The structure comprises an stack-up substrate of a top signal plane/ a first dielectric layer/ a ground plane/ a second dielectric layer/ a power plane/ a third dielectric layer/ a bottom signal plane. All layers are stacked and sintered as an assembled board. The assembled board has a plurality of via holes therein to connect the wiring on each signal plane, the power plane and the ground plane. In the power plane/ the second dielectric layer/ ground plane stacked layer contains at least one desired build-in capacitor. The build-in capacitor has high permittivity of dielectric material to obtain a sufficient large capacitance. The capacitance of the built-in capacitors is easily to adjust by filling different dielectric material into the different via holes and/or combined with adjusting the dielectric layer between power plane and ground plane if it is necessary.

The method of manufacturing the built-in capacitors in multi-layered substrate proposed by the present invention is to fill a dielectric material into each of predetermined via holes in the dielectric layer between power plane and ground plane. Preferably, the dielectric material used should have a very high dielectric constant value of about two orders of magnitude larger than that of the BT core.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As forgoing prior art depicted, when the multi-layered PCB devices operates at high frequency, it will cause the voltage fluctuations between power plane and ground plane. Especially, the BGA substrate or flip-chip package substrate has more serious problem than the PCB because of the limited space. To solve this issue, the conventional method is to use a by-pass capacitor connecting between power ring and ground ring adjacent to IC chip so as to filter the noises. An alternative method is to design a predetermined dielectric layer thickness associated with areas of the ground plane and power plane to obtain desired capacitance. However, the thickness adjustment so as to obtain the desired capacitance is inflexible. In addition, the assembled process will increase the cycle time.

The motivation of the present invention is thus to propose an efficient method in order to overcome the aforementioned issues.

Figure 1:
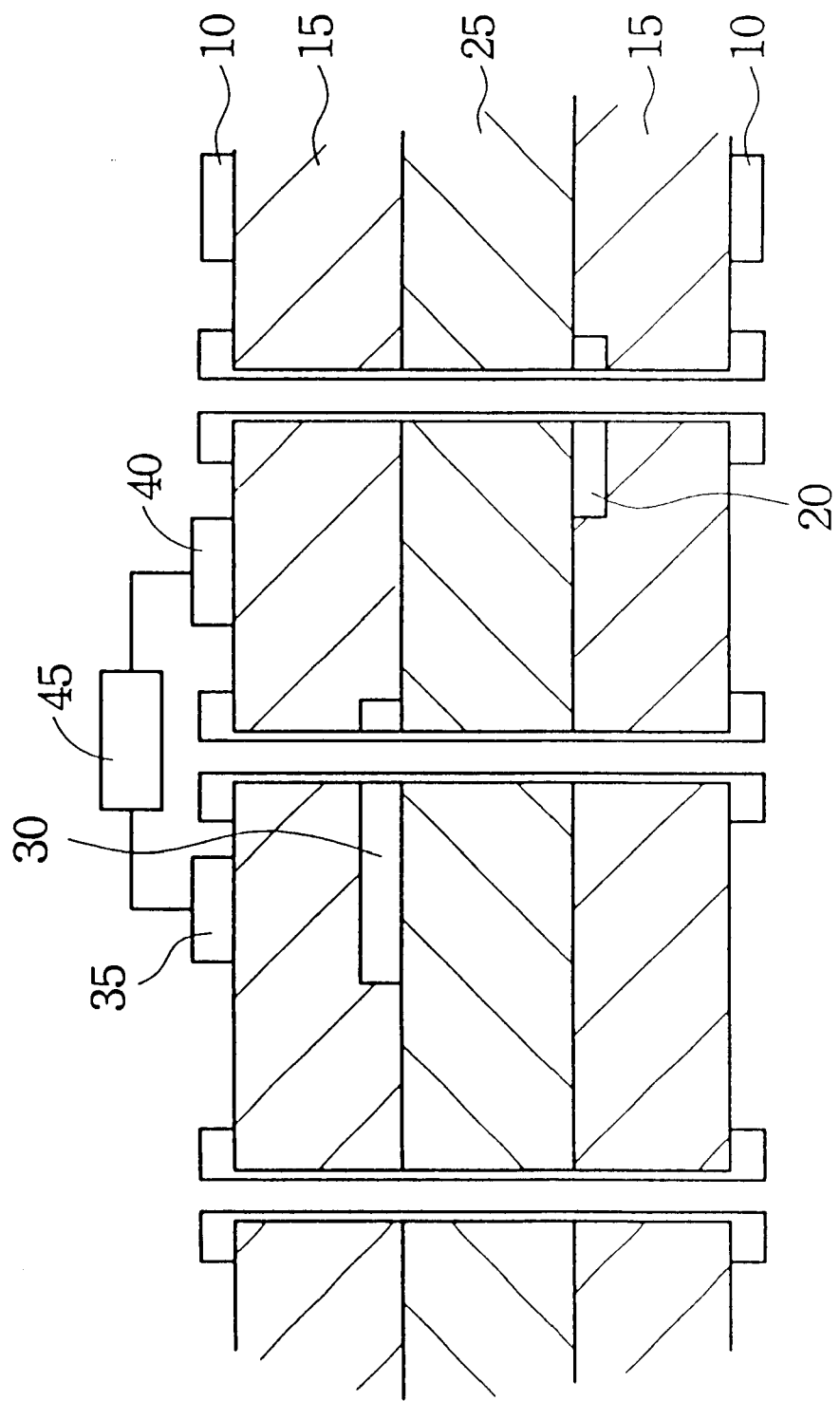
FIG. 1 shows a multi-layered substrate with a by-pass capacitor between power ring and ground ring in accordance with the prior art.
Figure 2:
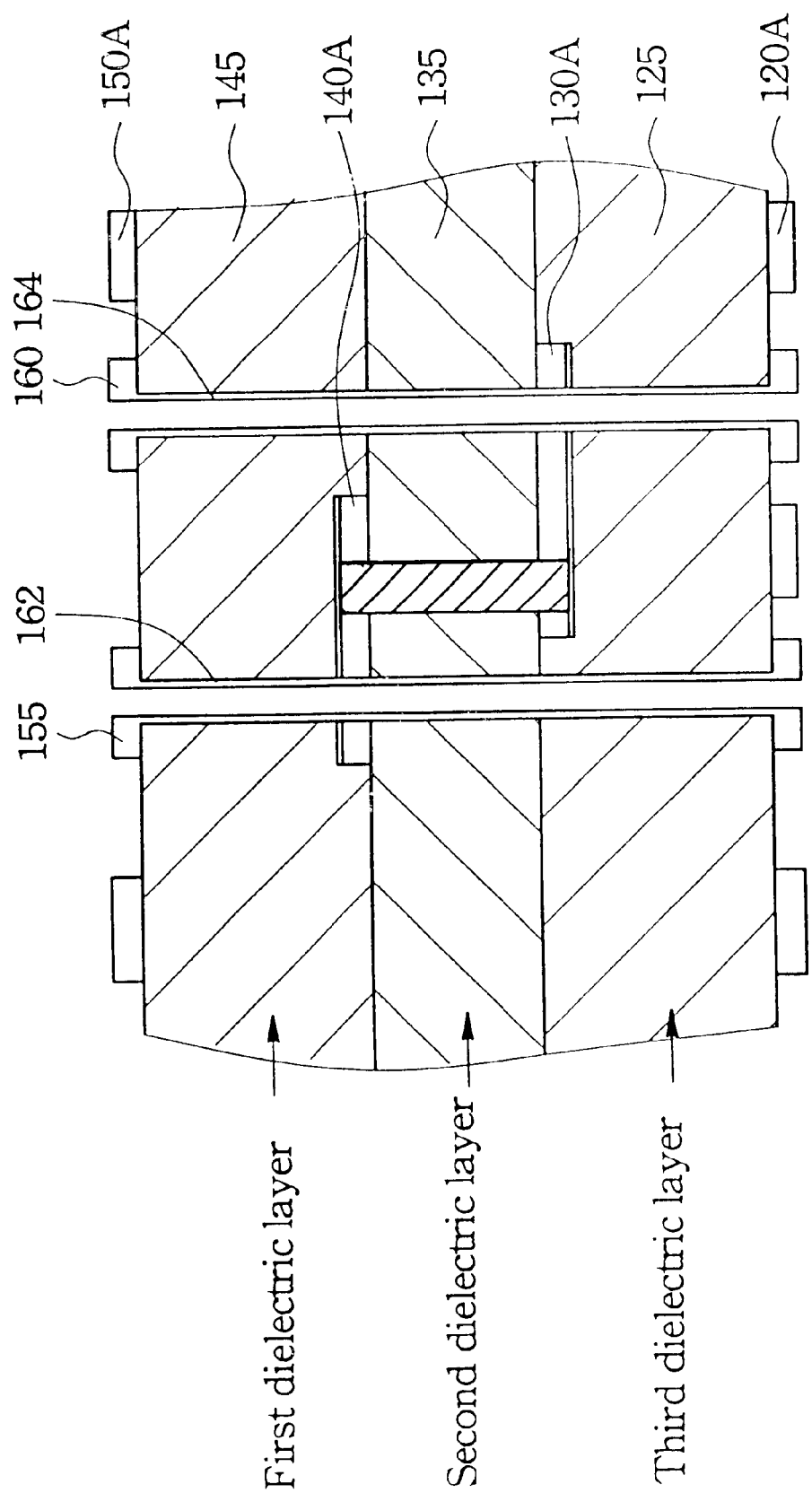
FIG. 2 shows a multi-layered substrate with a built-in capacitor between power plane and ground plane in accordance with a preferred embodiment of the present invention.

As is understood by a person skilled in the art, the following four-layer substrate as an embodiment of the present invention are illustrated of the present invention rather than limiting of the present invention. It is intended to cover various modifications and similar arrangements included within the spirit and scope of the appended claims, Since having a sufficient capacitance of the capacitor in the multi-layered substrate is demanded to filter the voltage fluctuation occurred at the power plane or to decrease the ground bouncing. The structure of the multi-layered substrate with a built-in capacitor is depicted in the FIG. 2. In the schematic diagram, the multi-layered substrate from the bottom sequentially comprises a bottom signal plane 120A, a power plane 130A, a ground plane 140A and atop signal plane 150A, and each of the adjacent two layers have a dielectric layer 125, 135, 145 in between.

The top signal plane 150A is to support the IC chips (not shown) and the related electric devices or a single BGA package chip (not shown) or flip-chip package chips (not shown) and has interconnection wires thereon to connect the devices. As BGA substrate is concerned, the IC chip having power pin (not shown) connects to the power ring 160 through the wire and the ground pin connects to the ground ring 155. The ground ring 155 and the power ring 160 through via holes 162, 164, respectively, connect to the ground plane 140A and power plane 130A and the others signal planes 150A and 120A.

In addition, the second dielectric layer 135 have extra predetermined via hole for stuffing with a variety of capacitor dielectric material so as to form build-in capacitors with different capacitance. The second dielectric layer 135 is formed of a FR4 glass fiber, BT core etc., which have dielectric constant only about 3.5 to 4.5. To build a desired build-in capacitance by using conventional method, a sufficient thinner dielectric layer is usually required, for example, 0.0015 inch or less. However, using the present method the predetermined via holes stuffs with about two order of magnitude capacitor dielectric material can easily achieve the desired capacitance. And most important, the capacitance is easier to adjust to match the variety requirements only by changing the material. Of course, to change capacitance in the present invention is merely to change the dielectric material. Furthermore, to fill in alternative material and/or combined with reducing the thickness of the dielectric layer can further increase the capacitance.

The method of manufacturing built-in capacitors in the multi-layer substrate was depicted as follows.

Figure 3:
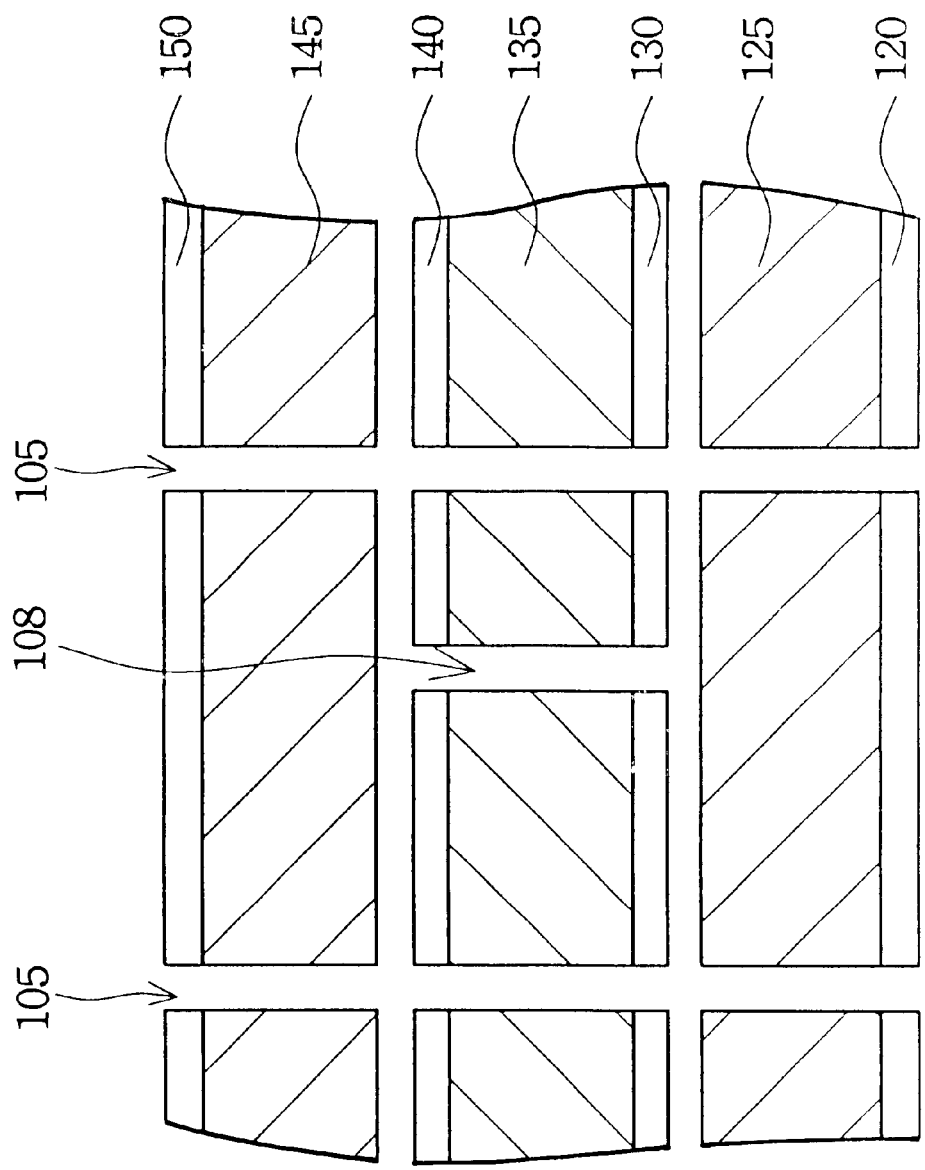
FIG. 3 shows the formation of a plurality of via holes in a multi-layered substrate in accordance with the present invention.

Referring to FIG. 3, firstly, a plurality of via holes 105 is formed by drilling the stack of the assembled substrate. The via holes 105 are to connect conductive trace layers. The assembled substrate is then separated. The second dielectric layer 135 is then drilled predetermined a plurality of holes for built-in capacitor formation. The assembled substrate herein comprises a first dielectric layer 145, a second dielectric layer 135, and a third dielectric layer 125. The first dielectric layer has two first conductive layers 140 and 130 thereon, such as copper layer, being respectively mounted on a top and a bottom surface to make as a power plane and a ground plane. The first dielectric layer 145 has a conductive layer 150 thereon prepared for forming the top signal plane. The third dielectric layer 125 has a conductive layer 120 thereon prepared for forming the bottom signal plane too. In a preferred embodiment, the BT core is about 0.25 to 0.6 mm, the via holes 105 are about 200–250 $\mu$m in diameter.

Figure 4:
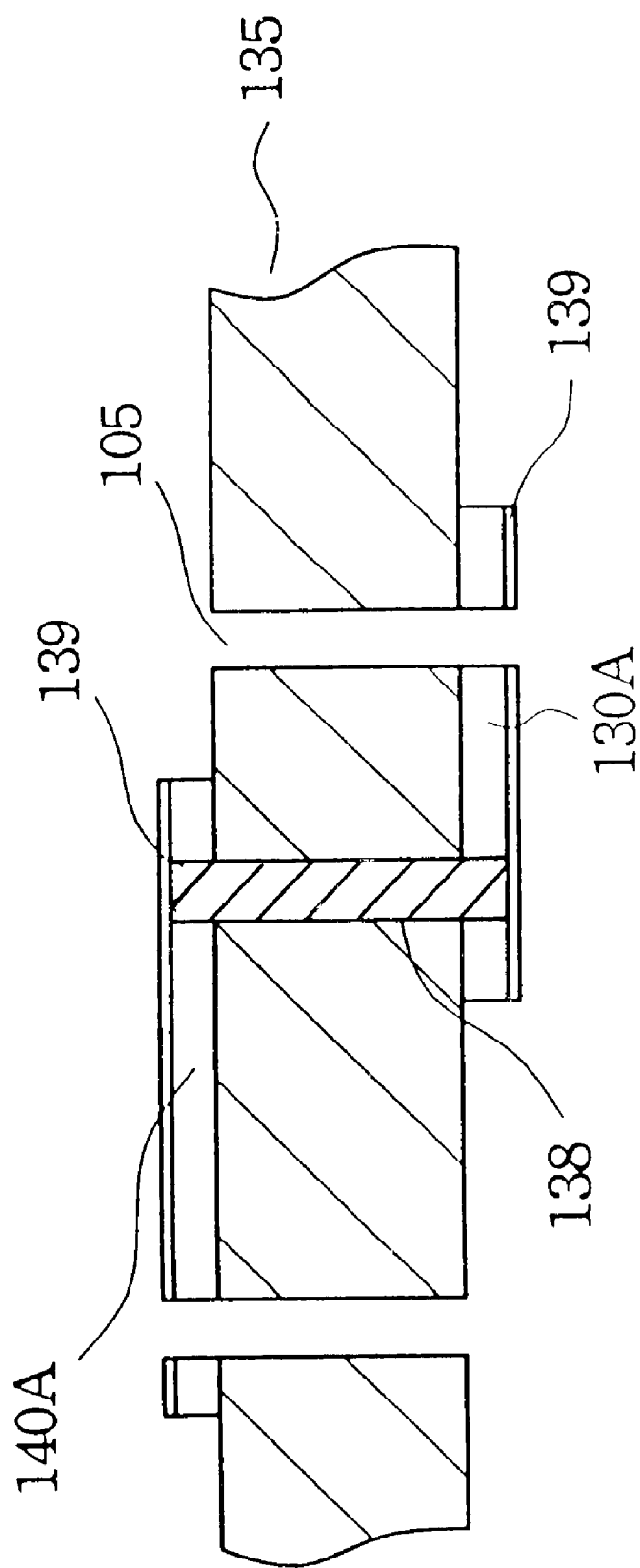
FIG. 4 shows a built-in capacitor formed between power plane and ground plane in accordance with a preferred embodiment of the present invention.

Thereafter, referring to FIG. 4, the predetermined via-holes 108, which are predetermined as capacitors in the second dielectric layer 135 are sealed their respective one open end and filled with high dielectric constant material. In the time, the via holes 105 are sealed. The capacitor dielectric 138 are material, such as the mixture of BaTiO3 powder and the organic material or the equivalent. After a dry film pattern (not shown) is coated on regions where they are required to electroplate with copper, an etching step is performed to etch away all exposed regions. Subsequently, the dry film is removed and a electroplating step is followed so as to form conductive layer 139 on the conductive trace layer 140A and 130A of the second dielectric layer 135 to form parallel capacitors plates. For BT substrate, the second dielectric layer 135, if the dielectric material 138 has dielectric constant of about 20–200, the capacitance is about 0.1 $\mu$F to several $\mu$F.

Figure 5:
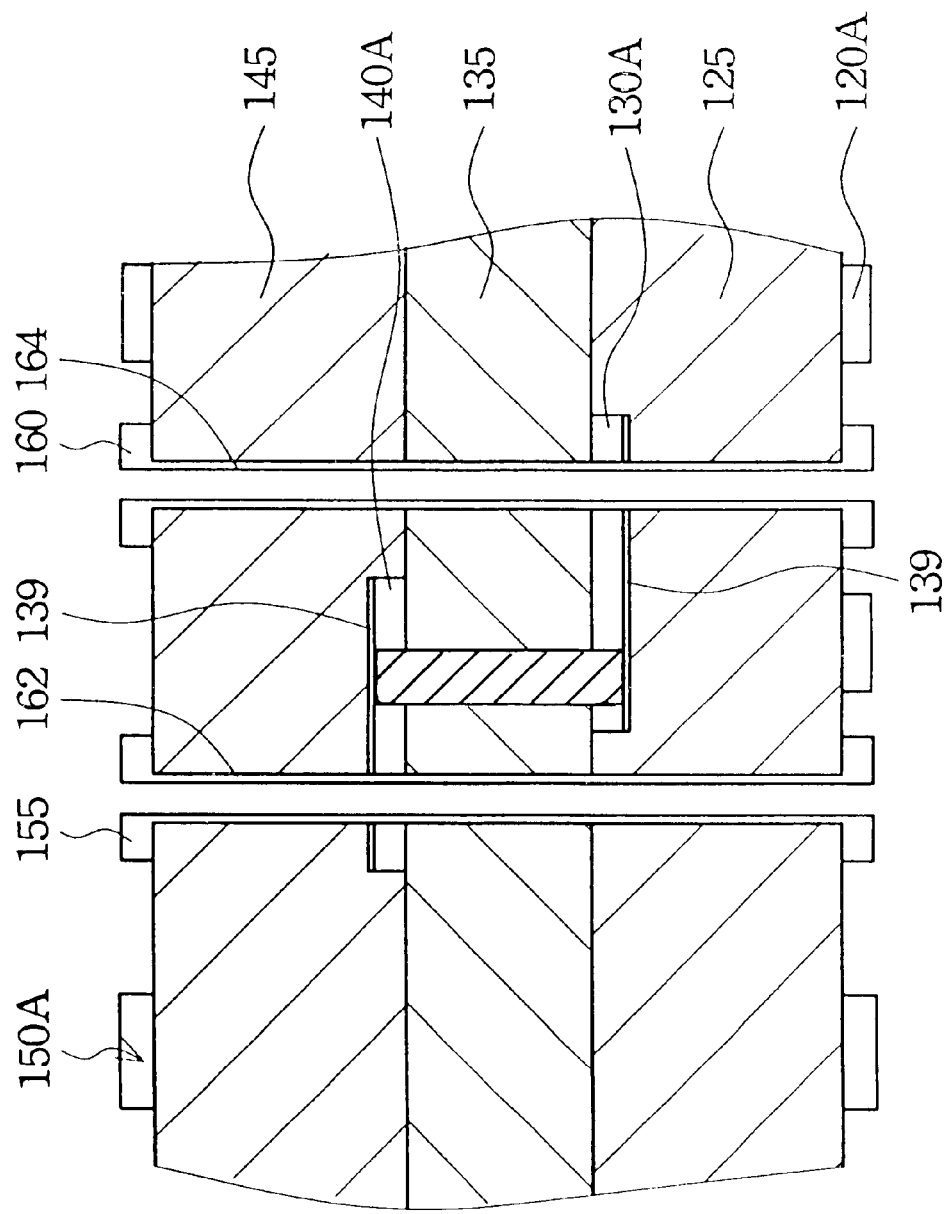
FIG. 5 shows a multi-layered substrate with a built-in capacitor between power plane and ground plane in accordance with a preferred embodiment of the present invention.

Referring to FIG. 5, the first conductive layer 150/ the first dielectric layer 145/ the ground plane 140A/ the second dielectric layer 135/ the power plane 130A/ the third dielectric layer 125/ the third conductive layer 120 is then stacked again and sintered to form the primitive multi-layered substrate. Thereafter, patterning the first conductive layer 150 and the third conductive layer 120 is performed as before to form a top signal layer 150A and a bottom signal plane 120A. At the same time, at least one power ring 160 and one ground ring 155 are formed on the top signal plane 150A. Finally, an electroplating process is performed to deposit conductive layer 164 and 162 on the plated through holes so as to connect the power ring 160 and power plane 130A and the ground ring 155 and ground plane 140A.

The present invention has following benefits:

(1) The method of forming built-in capacitors is easier than that of the conventional method.

(2) Furthermore, the built-in capacitors are easily to adjust the capacitance. The requirement is only filled different dielectric material into different via holes or combined with adjust the thickness of the second dielectric layer 135 to further alter the capacitance.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A multi-layered substrate structure, which can serve as a PCB and BGA supporting or a flip-chip build-up substrate, comprising:

a first substrate layer, comprising:
      a first dielectric layer;
      a top signal plane on a first surface of the first dielectric layer;
      a ground ring on the first surface of the first dielectric layer; and
      a power ring on the first surface of the first dielectric layer;
   a second substrate layer, comprising:
      a second dielectric layer;
      a ground plane on a first surface of the second dielectric layer;
      a power plane on a second surface of the second dielectric layer, wherein a hole is through the ground plane, the second dielectric layer and the power plane; and
   a capacitor, comprising:
      a first electrode plate on an outer surface of the ground plane;
      a second electrode plate on an outer surface of the power plane; and
      a capacitor dielectric in the hole, wherein the capacitor dielectric connects the first electrode plate and the second electrode plate and a dielectric constant of the capacitor dielectric is higher than that of the second dielectric layer;
   a third substrate layer, comprising:
      a third dielectric layer; and
      a bottom signal plane on a second surface of the third dielectric layer,
   wherein the second substrate being assembled between a second surface of the first dielectric layer and a first surface of the third dielectric layer;
   a first conductive layer on a surface of a first plated through hole, which is sequentially through the ground ring, the first dielectric layer, the first electrode plate, the ground plane, the second dielectric layer and the third dielectric layer; and
   a second conductive layer on a surface of a second plated through hole, which is sequentially through the power ring, the first dielectric layer, the second dielectric layer, the power plane, the second electrode plate and the third dielectric layer.

* * * * *